United States Patent [19]
Rolfson

[11] Patent Number: 5,194,345
[45] Date of Patent: Mar. 16, 1993

[54] METHOD OF FABRICATING PHASE SHIFT RETICLES

[75] Inventor: J. Brett Rolfson, Boise, Id.

[73] Assignee: Micron Technology, Inc., Boise, Id.

[21] Appl. No.: 699,752

[22] Filed: May 14, 1991

[51] Int. Cl.$^5$ .............................. G03F 9/00
[52] U.S. Cl. ........................ 430/5; 430/22; 430/269; 430/311; 430/396
[58] Field of Search ............... 430/5, 22, 269, 311, 430/396

[56] References Cited

U.S. PATENT DOCUMENTS

| | | | |
|---|---|---|---|
| 3,604,778 | 9/1971 | Burckhardt | 350/3.5 |
| 4,360,586 | 11/1982 | Flanders et al. | 430/321 |
| 4,902,899 | 2/1990 | Lin et al. | 250/492.1 |
| 5,045,417 | 9/1991 | Okamoto | 430/5 |
| 5,079,113 | 1/1992 | Ohta et al. | 430/5 |

OTHER PUBLICATIONS

Terasawa, et al., "0.3-micron optical lithography using a phase-shifting mask", SPIE vol. 1088 Optical/Laser Microlithography II (1989), p. 25.

Nitayama, et al., "New Phase Shifting Mask with Self-aligned Phase Shifters for a Quarter Micron Photolithograph", IEDM 89 (Jul. 1989), p. 57.

Levenson, et al., "The Phase-Shifting Mask II: Imaging Simulations and Submicrometer Resist Exposures", IEEE Transactions on Electron Devices, vol. ED-31, No. 6 (Jun. 1984), p. 753.

Lin, Burn J., "Phase Shifting and Other Challenges in Optical Mask Technology", IBM-EF-15 (Sep. 26, 1990).

Hanyu, et al., "New phase-shifting mask with highly transparent SiO2 phase shifters", SPIE vol. 1264 Optical/Laser Microlithography III (1990), p. 167.

Pfau, et al., "Exploration of fabrication techniques for phase shifting masks", Semiconductor Research Corporation (Sep. 11, 1990).

Neureuther, Andrew R., "Modeling Phase Shifting Masks", BASCUS Symposium (Sep. 26, 1990).

Fukuda, et al., "Phase-Shifting Mask and FLEX method for Advanced Photolithography", SPIE vol. 1264 Optical/Laser Microlithography III (1990), p. 14.

"LSI Process Lithography, Reticle, Stepper, DRAM", Nikkei Microdevice (Jul. 1990).

"64 M", Nikkei Microdevice (Jul. 1990).

Ku, et al., "Use of a $\pi$-Phase-Shifting X-Ray mask to Increase the Intensity Slope at Feature Edges", Semiconductor Research Corporation (Jun. 23, 1987).

Nakagawa, et al., "Fabrication of 64M DRAM with i-Line Phase-Shift Lithography", IEDM 90 (Apr. 1990), p. 817.

(List continued on next page.)

Primary Examiner—Marion E. McCamish
Assistant Examiner—S. Rosasco
Attorney, Agent, or Firm—Stephen A. Gratton

[57] ABSTRACT

A method of fabricating phase shifting reticles that can be used as a mask in photolithographic processes such as semiconductor wafer patterning. An opaque material is deposited onto a quartz substrate to a predetermined thickness. The opaque material is then patterned with openings to form a pattern of opaque light blockers and light transmission openings on the substrate. A phase shifter material is then deposited over the opaque light blockers and into the light transmission openings. This forms a pattern of rim phase shifters on the sidewalls of each light blocker with a light transmission opening between adjacent light blockers. In use, in photopatterning a semiconductor wafer, phase canceling produced by light diffracted through the rim phase shifters and by the opaque light blockers enhances the edge contrast of a pattern produced by the opaque light blockers.

19 Claims, 3 Drawing Sheets

OTHER PUBLICATIONS

Levenson, Marc D., "What IS a Phase-Shifting Mask?", IBM Research Report (Aug. 15, 1990).

Prouty, et al., "Optical Imaging with Phase Shift Masks", Technology Transfer #90080327A-MIN, p. 41.

"Second Phase Shift Mask Workshop", Japanese patent applications, SEMA-TECH, Technology Transfer #90100345A-MIN, p. 159.

Levenson, et al., "Improving Resolution in Photolithography with a Phase-Shifting Mask", IEEE Transactions on Electron Devices, vol. ED-29, No. 12 (Dec. 1982), p. 1828.

Terasawa, et al., "Improved resolution of an i-line stepper using a phase-shifting mask", J. Vac. Sci. Technol. B., vol. 8, No. 6 (Nov./Dec. 1990), p. 1300.

Jinbo, et al., "0.2 $\mu$m or Less i-Line lithography by Phase-Shifting-Mask Technology", IEDM 90 (Apr. 1990), p. 825.

Durnin, et al., "Diffraction-Free Beams" Physical Review Letters, vol. 58 (Apr. 13, 1987), p. 1499.

Yamanaka, et al., "A 5.9 $\mu m^2$ Super Low Power SRAM Cell Using a New Phase-Shift Lithography" IEDM 90 (Apr. 1990), p. 477.

Watanabe, et al., "Transparent Phase Shifting Mask", IEDM 90 (Apr. 1990), p. 821.

INCIDENT LIGHT

E-FIELD AMPLITUDE
AT RETICLE

E-FIELD AMPLITUDE
AT WAFER

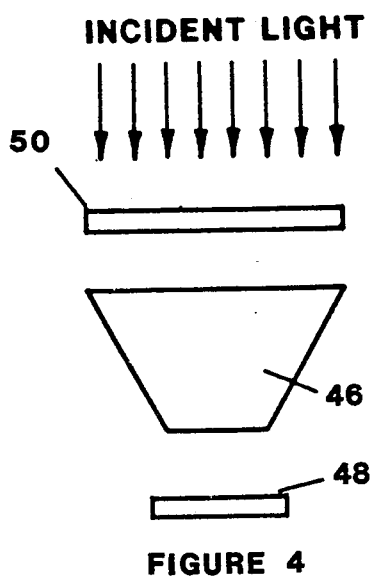
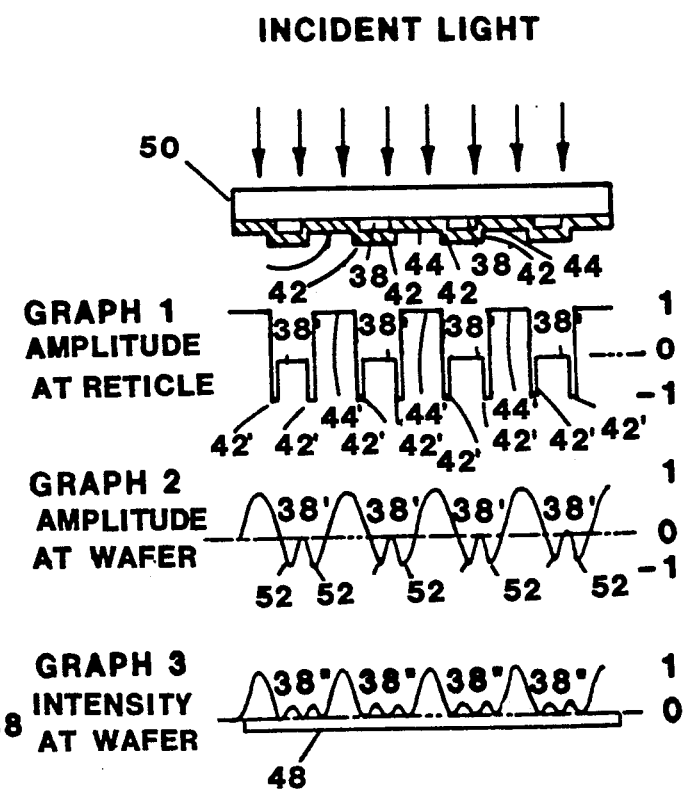
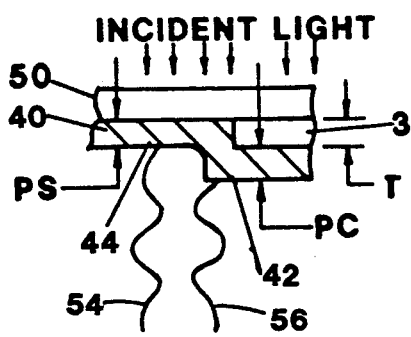

METHOD OF FABRICATING PHASE SHIFT RETICLES

FIELD OF THE INVENTION

This invention relates to semiconductor manufacture and more particularly to a novel process particularly suited to fabricating phase shifting reticles that can be used in fine-line photolithography.

BACKGROUND OF THE INVENTION

As semiconductor manufacturing advances to ultra-large scale integration (ULSI), the devices on semiconductor wafers shrink to sub-micron dimension and the circuit density increases to several million transistors per die. In order to accomplish this high device packing density, smaller and smaller feature sizes are required. This may include the width and spacing of interconnecting lines and the surface geometry such as corners and edges, of various features.

The requirement of small feature sizes with close spacing between adjacent features requires high resolution photolithographic processes. In general, photolithography utilizes a beam of light, such as U.V. waves, to transfer a pattern from a photolithographic mask onto a photoresist coating through an imaging lens. The mask includes opaque and transparent regions such that the shapes match those of the openings in the resist coating in the desired or predetermined pattern.

One technique currently being investigated for improving the resolution of the photolithographic process is known as phase shift lithography. With phase shift lithography the interference of light rays is used to overcome diffraction and improve the resolution and depth of optical images projected onto a target. In phase shift lithography, the phase of an exposure light at the object is controlled such that adjacent bright areas are formed preferably 180° out of phase with one another. Dark regions are thus produced between the bright areas by destructive interference even when diffraction would otherwise cause these areas to be lit. This technique improves total resolution at the object and allows resolutions as fine as 0.15 μm to occur.

An early patent in this field, U.S. Pat. No. 4,360,586 to Flanders et al, was issued on Nov. 23, 1982 and assigned to MIT. This patent was directed to exposing periodic optical features on an object surface. The features were characterized by a spatial period p. According to the invention, a source of radiant energy of wavelength λ illuminates a surface to be exposed through a mask having a spatial period separated from the surface by a distance approximately $S_n = p^2/n\lambda$, where n is an integer greater than one.

With respect to semiconductor fabrication numerous laboratory techniques have been proposed to employ phase shifting in the photopatterning of semiconductor wafers. Most of the work in this area has centered around either "Alternating Phase Shifting", "Subresolution Phase Shifting", or "Rim Phase Shifting" experiments. In general, in each of these techniques a phase shift mask or reticle is constructed in repetitive patterns of three distinct layers of material. An opaque layer on the mask provides areas that allow no light transmission therethrough, a transparent layer provides areas which allow close to 100% of light to pass through and a phase shifter layer provides areas which allow close to 100% of light to pass through but phase shifted 180° from the light passing through the transparent areas. The transparent areas and phase shifting areas are situated such that light rays diffracted through each area are canceled out in a darkened area therebetween. This creates the pattern of dark and bright areas which can be used to clearly delineate features of a pattern on a photopatterned wafer.

"Alternating Phase Shifting" as disclosed in [1] is a spatial frequency reduction concept similar to the method disclosed in the Flanders et al patent. It is characterized by a pattern of features alternately covered by a phase shifting layer. "Subresolution Phase Shifting" [2] promotes edge intensity cut off by placing a subresolution feature adjacent to a primary image and covering it with a phase shifting layer. "Rim Phase Shifting" [3] overhangs a phase shifter over a chrome mask pattern.

In general, these phase shifting techniques have not been adapted to large scale semiconductor manufacturing processes. One problem with applying phase shifting lithography into practical use, in manufacturing semiconductors, is the difficulty in reticle mask making, inspection, and repair. The process must be compatible with manufacturing conditions, (i.e. inexpensive, repetitive, clean) and prior art laboratory techniques have not heretofore met these criteria.

A representative state of the art semiconductor laboratory process for making a rim phase shift mask or reticle is shown in FIGS. 1A-1C. A transparent quartz substrate 10 has a film of an opaque light blocking material 12 such as chromium (CR) deposited thereon. A transparent phase shifter material 14 such as (SiO₂) is then deposited onto the opaque film 12. The phase shifter material 14 is selected with an index of refraction and with a thickness "t" that preferably produces a 180° (π) phase shift for light passing therethrough. This thickness "t" can thus be determined by the formula:

$$t = \frac{i\lambda}{2(n-1)}$$

where
t = thickness of phase shift material
i = an odd integer
λ = wavelength of exposure light
n = refractive index of phase shifter material at the exposure wavelength Next, and as shown in FIG. 1B, a layer of resist 16 is deposited and patterned onto the phase shifter layer 14. After etching and stripping steps, this forms a pattern of opaque light blockers 18 each having a rim phase shifter 20 formed thereon.

Next, and as shown in FIG. 1C, an isotropic wet etch is performed to undercut the opaque light blockers 18 to form wings 22 of phase shifting areas along the rim of the pattern created by the opaque light blockers 28. The finished reticle 24 can be then used as a mask as shown in FIG. 2A in photopatterning a wafer.

As illustrated graphically in FIGS. 2B-2C phase shifting only takes place on opposite sides (i.e. the rim) of the patterns formed by the opaque light blockers 18. The areas of zero light intensity correspond to the pattern made by the opaque light blockers 18. This prevents large areas of negative amplitude that promote an undesirable intensity along the dark edges of the image. As is apparent, the only image improving function of rim phase shifters is in edge contrast enhancement.

There are several inherent problems with such a method of producing rim phase shifters 20. Firstly, undercutting the opaque light blockers 18 may cause rough edges to be formed on the opaque light blockers 18. This edge roughness may be transferred to the printed wafer Secondly, the overhanging wings 22 of the rim phase shifters 20 can flake off during cleaning and handling of the reticle. This may cause contaminants in the process and produce patterning errors in the finished wafer.

Moreover, a reticle formed by such a process may be very difficult to repair. If a wing 22 of a rim phase shifter 20 breaks off, for instance, it cannot easily be replaced. Moreover, the distance of the wing 22 overhang is difficult to accurately control.

In addition, the thickness of the rim phase shifters 20 must be accurately and uniformly formed. Any variation in the thickness of the rim phase shifters 20 will adversely affect the phase shifted image. With a deposited phase shift material, it may be difficult to accurately control this thickness.

The process of the invention is directed to a process that overcomes these prior art limitations and provides a clean, repetitive, technique for forming accurate rim phase shifting reticles suitable for large scale semiconductor manufacturing.

SUMMARY OF THE INVENTION

In accordance with the present invention a simple yet unobvious method of fabricating rim phase shifting reticles for semiconductor photolithography is provided. The method, in general, includes the steps of:

depositing an opaque film on a transparent substrate to a predetermined thickness "t";

forming a first pattern of openings through the opaque film to the substrate to form a pattern of opaque light blockers and light transmission openings; and conformally depositing a phase shifter material over the opaque light blockers and into the openings to form rim phase shifters on the sidewalls of the opaque light blockers on the edge of a pattern formed by the opaque light blockers on either side of each light transmission opening.

In use as a reticle, during photopatterning of a wafer, incident light is directed through the quartz substrate. Light passing through a rim phase shifter must travel a greater distance than light passing through an adjacent light transmission opening. The thickness of the rim phase shifters and index of refraction of the phase shifter material are selected such that light diffracted through a rim phase shifter is 180° ($\pi$) out of phase with light passing through the adjacent light transmission opening. This phase canceling occurs along the edges or rim of the pattern formed by the opaque light blockers on either side of each light transmission opening. The opaque light blockers form areas of zero light intensity on the wafer in the desired pattern. The edge contrast of the pattern is, therefore, clearly delineated by the phase canceling.

Numerous other features, objects, and advantages of the invention will become apparent from the following specification when read in connection with the accompanying drawing, in which:

BRIEF DESCRIPTION OF THE DRAWING

FIG. 4 is a diagrammatic representation of a rim phase shifting reticle fabricated in accordance with the invention in use during phase shift photolithography of a semiconductor wafer;

FIG. 5 is a diagrammatic representation showing the composition and amplitude of light waves passed through a rim phase shift reticle formed in accordance with the invention; and FIG. 6 is a diagrammatic representation of a portion of a rim phase shifting reticle fabricated in accordance with the invention showing the phase shifting of light rays passed through a rim phase shifter with respect to light passed through an adjacent light transmission opening.

DETAILED DESCRIPTION OF PREFERRED EMBODIMENTS

As used herein, the term "reticle" and "mask" are interchangeable. Additionally, the disclosure refers to various materials which are electrically either conductive, insulating, or semiconducting; although the completed semiconductor circuit device itself is usually referred to as a "semiconductor".

Referring now to FIGS. 3A-3D, a method of fabricating a rim phase shift reticle in accordance with the invention is shown.

Figure 3A:
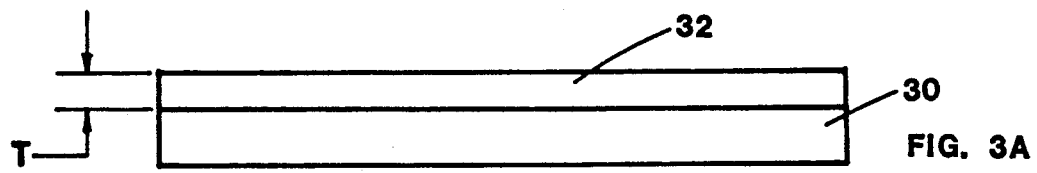
FIGS. 3A-3D are diagrammatic representations showing the steps involved in fabricating a rim phase shifting reticle in accordance with the invention.
Figure 3B:
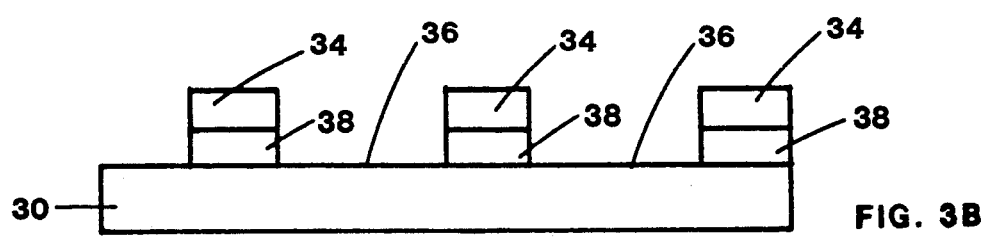
Figure 3C:
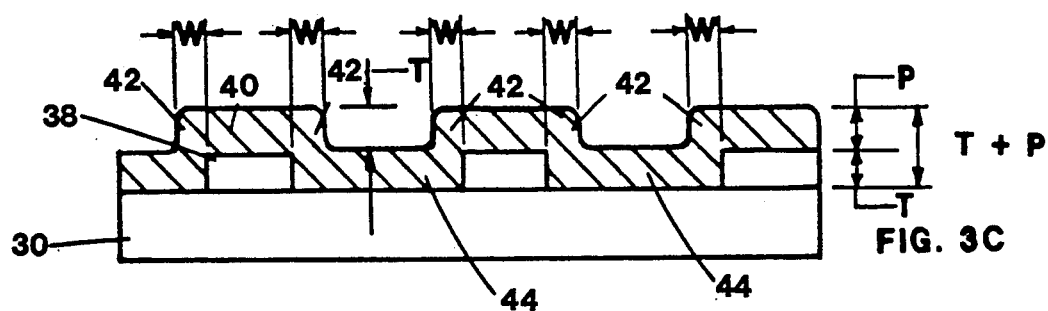
Figure 3D:
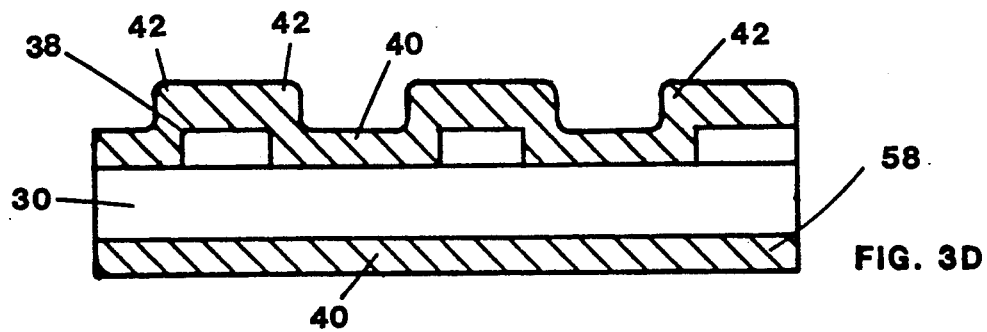

The method of the invention includes the steps of:

depositing an opaque film on a transparent substrate to a predetermined thickness "t", (FIG. 3A);

forming a pattern of openings through the opaque film to the substrate to form a pattern of opaque light blockers and light transmission openings (FIG. 3B);

conformally depositing a phase shifter material over a top surface and sidewalls of the opaque light blockers and into the light transmission openings to a thickness "P" such that phase shifters of a thickness of "P" + "t" are formed along the rim of a pattern produced by the opaque light blockers on either side of each light transmission opening (FIG. 3C); and optionally depositing a layer of a phase shifting material on an opposite surface or side of the transparent substrate from the opaque light blockers (FIG. 3D). Phase shifting material previously deposited on the opposite surface of the transparent substrate such as by chemical vapor deposition (CVD) may also be removed without adversely affecting the reticle.

With reference to FIG. 3A, a phase shift reticle fabricated in accordance with the invention is formed on a transparent substrate 30. In an illustrative embodiment of the invention the transparent substrate 30 is quartz (QZ). Quartz is a highly purified glass favored for its optical properties, inherent stability at high temperatures and its cleanliness. Quartz is typically utilized as the mask substrate material in optical projection systems and is highly transparent in the UV region. Alternately, the substrate 30 may be formed of any other transparent material having suitable optical and mechanical properties.

An opaque film 32 is deposited upon the quartz substrate 30. The opaque film 32 is deposited to a predetermined thickness "t" which, as will hereinafter be explained, helps to determine the 180° ($\pi$) phase shift produced by rim phase shifters subsequently formed on the quartz substrate 30.

The opaque film 32 may be deposited onto the substrate 30 by conventional processes such as sputtering; chemical-vapor deposition (CVD), or electron beam deposition (EBD). In the illustrative embodiment, the opaque film 32 material is chromium (CR), which is typically utilized in such applications. Chromium (CR) is characterized by mechanical properties suitable for plating and is more than 90% opaque to wavelengths in the UV and deep UV region. Other opaque films however, such as iron oxide and aluminum would also be suitable for the application.

Next and as shown in FIG. 3B, a photosensitive layer of photo resist 34 is coated and patterned onto the opaque film 32 by techniques known in the art, such as an E-beam writing or laser pattern writing. An etch and strip step may then be used to form a pattern of openings 36 through the opaque film 32 to the substrate 30 and a pattern of opaque light blockers 38. Each opaque light blocker 38 preferably has sidewalls that extend from the surface of the substrate 30 in a generally vertical direction. This configuration can be achieved by an anisotropic etch.

Next and as shown in FIG. 3C a phase shifter material 40 is blanket deposited over the opaque light blockers 38 and into the openings 36. The phase shifter material 40 may be deposited by any conventional process such as evaporation, or chemical vapor deposition CVD. The phase shifter material 40 may be any transparent material that has an index of refraction with light that is different than the index of refraction for light with air. It is also preferable to utilize an inorganic material that is transparent in the UV and deep UV regions where most photolithographic processes are performed. This may, for example, be at a wavelength of about 248 nm for KrF excimer laser lithography. Photolithography may also be performed in the range of the UV i-line (365 nm) or the UV g-line (436 nm) which are also common wavelengths used in photolithographic processes.

A suitable phase shifter material 40 is (SiO$_2$) which is commonly used as the mask substrate material in semiconductor optical projection systems. Another suitable phase shifter material is silicon nitride (SiN$_2$).

The phase shifter material 40 may be conformally deposited as shown in FIG. 3C to a thickness of "P". Such a conformal blanket deposition produces rim phase shifters 42 on the sidewalls of each light blocker 38 on either side of each light transmission opening 44. Each rim phase shifter 42 is characterized by a thickness of "t"+"P" measured from the surface of the substrate and by a width "W" measured from an edge of an opaque light blocker 38 to an edge of the phase shifter material 40. The width "W" obtained is a function of the thickness "P" of the conformal deposition. This thickness "P" and also the width "W" may be selected as desired. The width "W" is equivalent to the overhang dimension of the prior art phase shifter wings 22 shown in FIG. 1C. A desired geometry may be achieved by the accurate conformal deposition of the phase shifter material 40 over the opaque light blockers 38 and along the opposite sidewalls of the light blockers 38.

A light transmission opening 44 is formed between each rim phase shifter 42. With a conformal deposition of phase shifter material 40, each light transmission opening 44 is also covered with phase shifter material 40 to a thickness "t" measured from the surface of the quartz substrate 30 to a top surface of the phase shifter material 40. Incident light passing through a light transmission opening 44 must, therefore, travel a distance of "P" through the phase shifter material 42. On the other hand, incident light passing through a phase shifter 42 must travel a distance of "P"+"t". This difference in phase shifter material thickness between the light transmission openings 44 and the phase shifters 42 ("P" versus "P"+"t") produces a relative phase shift of preferably 180° ($\pi$).

This relationship is more clearly illustrated in FIG. 6. For a perfectly conformal deposition of phase shifter material 40, the thickness "P$_c$" of the phase shifter material 40 covering the opaque light blockers 38 is equal to the thickness "P$_a$" of the phase shifter material covering the light transmission opening 44. Incident light directed through a rim phase shifter 42 must thus travel a further distance of "t" through the phase shifter material 40. This distance "t" along with the phase shifter material 40 are preferably selected to provide a phase shift of 180° ($\pi$).

This optional thickness for achieving a 180° ($\pi$) phase shift may be determined by the previously stated formula:

$$t = \frac{i\lambda}{2(n - 1)}$$

In this case, the thickness "t" of the opaque light blockers 38 ultimately affects or determines the thickness of the rim phase shifters 42. The thickness "t" of the opaque light blockers 38 must therefore be accurately controlled to provide the 180° phase shift. This may be done by an accurate initial deposition of the opaque film 12 to an exact thickness "t". Alternately, the opaque film 12 may be over deposited and then polished back to the thickness of "t". This may be done by techniques which are known in the art, such as by chemical mechanical planarization (CMP).

As an example, at an exposure wavelength of 365 nm (i-line), (SiO$_2$) has a refractive index of 1.48. This implies one optional thickness "t" for achieving a 180° phase shift of t=3800Å.

In FIG. 6, the 180° ($\pi$) phase shift of light passed through a light transmission opening 40 versus light passed through a rim phase shifter 42 is illustrated with light waves 54 and 56. Light wave 56 diffracted through rim phase shifter 42 must travel an additional distance of "t" through the phase shift material 40 and is 180° ($\pi$) out of phase with light passed through a light transmission opening 40.

This is the basic method of the invention (FIGS. 3A-3C). As an optional step and as shown in FIG. 3D, phase shifter material 40 may also be deposited onto an opposite surface 58 of the quartz substrate from the opaque light blockers 38 with no degradation of phase shifting image quality.

This layer of phase shifter material 40 on opposite substrate surface 58 may occur as a result of a chemical vapor deposition (CVD) process wherein deposition occurs on both sides of the substrate. The opposite layer of phase shifter material helps to insure a smooth and optically flawless surface 58 for light transmission therethrough. The layer of phase shifting material 40 on opposite substrate surface 58 is not essential, however, to the practice of the invention, and the layer may also be removed if initially deposited.

Figure 1A:
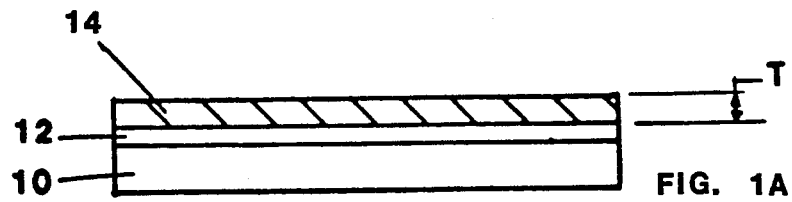
FIGS. 1A-1C are diagrammatic representations of the steps involved with a prior art process for forming a reticle with rim phase shifters.
Figure 1B:
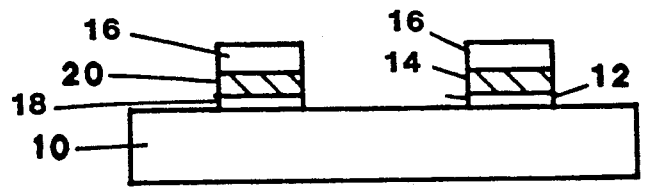
Figure 1C:
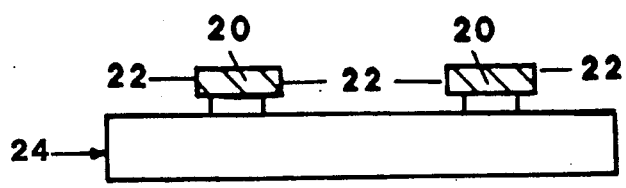
Figure 2A:
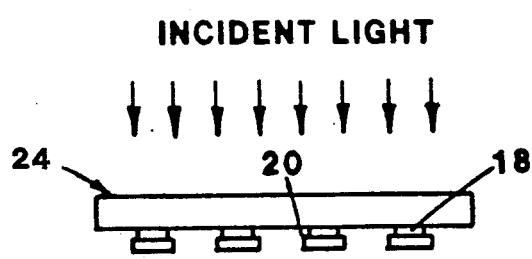
FIGS. 2A-2C are diagrammatic representations showing the composition and amplitude of light waves passed through a prior art rim phase shift reticle.
Figure 2B:
Figure 2C:
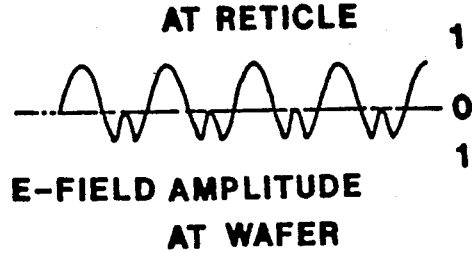

The illustrative method of fabricating a rim phase shifting reticle (FIGS. 3A-3C) is much simpler and more repeatable than the previously described prior art method (FIGS. 1A-1C). The method of the invention eliminates the etching of the dual layer (phase shift and mask pattern material) and the subsequent isotropic undercut etch of the mask pattern material. Process controllability and repeatability are thus greatly enhanced Additionally, the method of the invention allows more variety of materials for the opaque light blockers 38 than for prior art methods and more variety for clean up. With the method of the present invention, for example, it is possible to use aluminum for the opaque light blocking material and still clean using a conventional sulfuric acid clean. Aluminum is normally attacked by such a clean; but with the present method, the opaque light blockers 38 are totally encapsulated and protected by the phase shift layer 40.

Moreover, defects are much lower on the reticle because there is no wing 22 (FIG. 1C) to flake off and cause contamination. In addition, inspection and repair are easier than the prior art method. It is very difficult, for example, to replace a damaged wing 22 (FIG. 1C); but a defect such as a pinhole in the phase shifter layer 40 of the present method can be repaired using conventionally available equipment. Likewise, with the prior art method, it is impossible to repair chrome pinholes because the phase shifting layer 20 (FIG. 1B) covers the chrome pattern 18. With the present method, pinhole repairs are possible in a conventional manner because the opaque light blocking layer 32 is written prior to application of the phase shifting layer 40.

Finally, the geometry of the phase shifters including the distance "W" (FIG. 3C) that is equivalent to the width of the wing 22 (FIG. 1C) overhang is much more controllable with the method of the present invention. The prior art method relies upon a wet etch to produce the overhang. The method of the present invention relies on CVD, or other more controllable techniques. Moreover, the thickness of "t" can be more accurately controlled by the initial deposition of the opaque light blockers 18 and, if desired, by chemical mechanical planarization (CMP) of the light blockers 18.

Referring now to FIG. 4 a phase shift reticle 50 formed by the method of the invention is shown in use in a photolithographic process for photopatterning a semiconductor wafer 48. The phase shift reticle 50 is situated between the incoming incident light (i.e. KrF laser) and a wafer 48 to be processed. A reduction lens 46 is located between the phase shift reticle 50 and wafer 48. In the illustrative embodiment the reduction lens 46 is a 5x reduction system. Alternately other reduction systems such as 10X, 4X, or 1X may be utilized.

In the illustration of FIG. 4 a step and repeat system is utilized. In this system the wafer 48 is stepped under the lens 46 to expose the pattern in sections over the entire surface of the wafer 48. This is a typical application for a reticle 50 formed in accordance with the invention although other applications may also be possible including photopatterning of items other than semiconductor wafers.

Referring now to FIG. 5 an analysis of the composition of light waves at the reticle 50 and at the wafer 48 is shown. As illustrated by Graph 1, light passes through a light transmission opening 44 at a full intensity 44' and through a rim phase shifter 42 at full intensity 42' but shifted 180° ($\pi$). Light is completely blocked by the opaque light blockers 38 which are formed to achieve the desired pattern.

As illustrated by Graph 2, a canceling of diffracted light rays occurs at the edges or rim of the pattern produced by the opaque light blockers 38. The amplitude of diffracted light at the rim of the pattern is thus reduced by a destructive interference or canceling of the out-of-phase light rays diffracted along the rim or opposite parallel edges of pattern area 38'. The reduced intensity peaks along the rim of the pattern as denoted by reference numeral 52 in Graph 2.

As shown in Graph 3 at the wafer 48, the rim of the pattern 38" is darker than it would otherwise be with the edge contrast of the pattern enhanced by the canceling effect produced by the rim phase shifters 42.

Thus, the invention provides a simple yet unobvious method of fabricating phase shift reticles adapted for use in semiconductor photolithographic processes. While the process of the invention has been described with reference to a preferred embodiment thereof, as will be apparent to those skilled in the art, certain changes and modifications can be made without departing from the scope of the invention as defined by the following claims.

We claim:

1. A method for forming a phase shifting reticle for semiconductor manufacture comprising:

depositing an opaque material on a transparent substrate to a predetermined thickness of "t";

forming a first pattern of opening through the opaque material to the substrate to form a pattern of opaque light blockers on the substrate having generally vertical sidewalls with light transmission openings therebetween; and conformably depositing a phase shifter material over the opaque light blockers and into the light transmission openings to form self aligned rim phase shifters on the sidewalls of the opaque light blockers on either side of each light transmission opening such that light passed through a phase shifter is shifted with respect to light passed through a light transmission opening with a phase shift determined by an index of refraction of the phase shift material and by the thickness "t".

2. The method as recited in claim 1 and wherein:

a thickness "t" of the opaque material and an index of refraction of the phase shifter material are selected to form rim phase shifters which produce a phase shift of approximately 180°.

3. The method as recited in claim 2 and wherein:

forming the pattern of openings in the opaque material is with a first photolithography process and an anisotropic etch.

4. The method as recited in claim 3 and wherein:

conformally depositing the phase shifter material is with a blanket chemical vapor deposition (CVD).

5. The method as recited in claim 3 and wherein:

the opaque material is chromium (CR).

6. The method as recited in claim 3 and wherein:

the opaque material is aluminum (Al).

7. The method as recited in claim 3 and wherein:

the phase shifter material is ($SiO_2$).

8. The method as recited in claim 3 and wherein:

the transparent substrate is quartz.

9. A method of forming a phase shifting reticle for use in semiconductor photolithography comprising:

depositing a film of opaque material on a transparent quartz substrate to a predetermined thickness of "t";

photopatterning and anisotropically etching the film of opaque material with a pattern of openings through the opaque film to the substrate to form a pattern of opaque light blockers having generally vertical sidewalls;

conformally blanket depositing phase shifter material into the openings to a thickness "P" to form light transmission openings and over a top surface and sidewalls of the opaque light blockers to the thickness of "P" to form self aligned rim phase shifters on the sidewalls of the opaque light blockers of a thickness of "t"+"P" on either side of the light transmission openings and with an index of refraction of the phase shifter material and thickness of "t" of the opaque light blockers selected to provide a phase shift of 180° or a multiple thereof.

10. The method as recited in claim 9 and wherein: the thickness "t" is determined by the formula $$t = \frac{i\lambda}{2(n-1)}$$

where
t = thickness of opaque material
i = an odd integer
λ = wavelength of exposure light
n = refractive index of phase shifter material at the exposure wavelength.

11. The method as recited in claim 10 and further comprising:
directing an incident light through the phase shift reticle onto a target wafer in a photolithography process to produce cancelling along a rim of a pattern defined by the opaque light blockers.

12. The method as recited in claim 11 and wherein: the substrate is quartz, the opaque material is chromium (CR), and the phase shifter material is (SiO2).

13. A method for forming a phase shifting reticle for use in semiconductor photolithography comprising:
depositing an opaque material on a transparent substrate to a thickness "t";
depositing a photosensitive resist onto the opaque material, patterning the resist, and anisotropically etching a pattern of openings into the opaque material to form a pattern of opaque light blockers having generally vertical sidewalls;
blanket conformally depositing a phase shifter material over the opaque material and into the opening to a thickness of "P" such that each opening is covered with phase shifter material to a thickness "P" measured from the substrate as a light transmission opening and each opaque light blocker is covered with phase shifter material to a thickness of "P" measured from a top surface of the opaque material and each sidewall of each light blocker is covered with phase shifter material to a width of "W" to form self aligned rim phase shifters on either side of each opaque light blocker with a thickness of "P"+"t" measured from the substrate.

14. The method as recited in claim 13 and wherein: an opposite side of the substrate from the opaque light blockers is coated with a phase shifter material.

15. The method as recited in claim 13 and further comprising:
directing incoming light in a photolithographic process, through the rim phase shifters to produce a phase canceling of light diffracted along edges of a pattern produced by the opaque light blockers.

16. The method as recited in claim 13 and wherein: thickness "t" is achieved by deposition.

17. The method as recited in claim 13 and wherein: thickness "t" is achieved by polishing.

18. The method as recited in claim 17 and wherein: polishing is by chemical mechanical planarization (CMP).

19. The method as recited in claim 13 and wherein: thickness "t" and an index of refraction of the phase shifter material are selected to achieve a 180° phase shift.

* * * * *